July 13, 1965 M. W. WEGNER ETAL 3,195,026

HERMETICALLY ENCLOSED SEMICONDUCTOR DEVICE

Filed Sept. 21, 1962

WITNESSES:
Leon M. Garman
Raymond H. Majesko

INVENTORS
Mary W. Wegner and
Kendall K. Conger
BY
Frederick Shapoe
ATTORNEY

United States Patent Office 3,195,026
Patented July 13, 1965

3,195,026

HERMETICALLY ENCLOSED SEMICONDUCTOR DEVICE

Mary W. Wegner and Kendall K. Conger, Camarillo, Calif., assignors to Westinghouse Electric Corporation, East Pittsburgh, Pa., a corporation of Pennsylvania Filed Sept. 21, 1962, Ser. No. 225,353
5 Claims. (Cl. 317—234)

Figure 1:
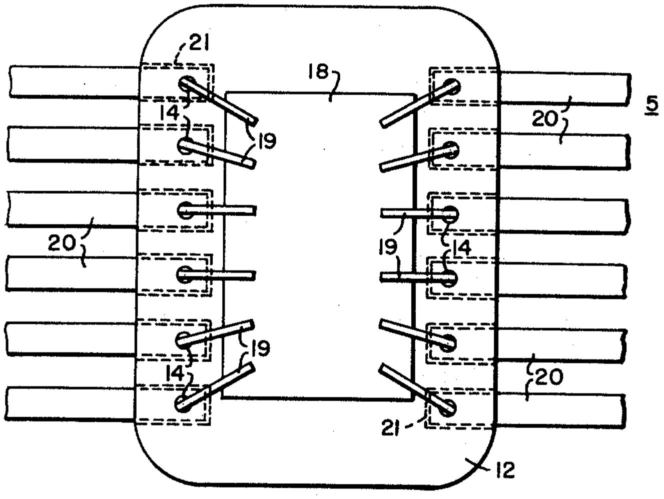

The present invention relates to a semiconductor device and, in particular, to a functional electronic element and a hermetic enclosure for the same.

The expanding development and use of solid state semiconductor devices and especially functional electronic element devices is accompanied by a strong need for a satisfactory miniaturized sealed package or enclosure. Heretofore difficulties have been encountered in reducing the package size and thickness while providing a relatively good path for heat dissipation from the semiconductor element to an external heat sink; the attainment of a good hermetic seal for the semiconductor element and particularly at the junction between the walls of the enclosure and leads projecting externally; and, providing suitable external lead arrangements to provide versatility in means of making interconnections and for ease of mounting the device on a supporting structure. The hermetic package referred to hereinafter may be employed to encapsulate all types of semiconductor elements, such as, for example, silicon or germanium diodes or transistors or for encapsulating a complete functional electronic element and other electronic devices.

A functional electronic element is normally comprised of a body of semiconductor material, for example, germanium, silicon, and stoichiometric III–V and II–VI compounds. The body is comprised of at least one active region, such as, a diode, transistor, four-region-two or three terminal devices or combinations thereof, usually at least one region functioning as a capacitance or a capacitance area disposed upon at least one surface of the body and usually at least one region functioning as a resistance either fixed or variable. The body may also contain an inductance in addition to or in place of the resistance. The various regions and areas are connected in circuit relationship through the bulk of the body or by external electrical connections. External electrical leads affixed to the body are input, output and in some instances biasing or control leads. Examples of such functional electronic blocks can be found in U.S. patent applications, Serial Nos. 89,498, filed February 15, 1961; 176,723, filed March 1, 1962; and, 178,476, filed March 8, 1962, all of which are assigned to the assignee of the present invention.

An object of the present invention is to provide a semiconductor device comprising a relatively thin electrically insulating base member, an upwardly extending metallic flanged frame member joined to the outer periphery of the base member, the walls of the flanged member and the upper surface of the base meber delineating a cavity, a semiconductor member disposed within the cavity and joined to the base member, electrical leads passing through the wall of the base member and connected to the semiconductor member and a cover plate joined to the flanged frame member to hermetically enclose the semiconductor member.

A further object of the invention is to provide a thin flat hermetic enclosure embodying a semiconductor device disposed within and joined to a surface of the enclosure to enable heat to dissipate readily and leads passing through the walls of the enclosure connected to the device.

Other objects of the invention will, in part, be obvious and will, in part, appear hereinafter.

Figure 2:
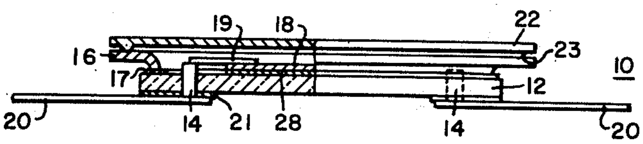

In order to more fully understand the nature and objects of the invention, reference should be had to the following detailed description and drawings, in which:

FIGURE 1 is a plan view of the inner portion of the semiconductor device of the invention; and, FIG. 2 is an elevation view, partly in cross-section, of the device of the invention.

In accordance with the present invention and in attainment of the foregoing objects there is provided a semiconductor device comprising, in a stacked arrangement, (1) a relatively thin, substantially flat electrically insulating base member having a plurality of terminal pins extending vertically therethrough, and an isolated metallized portion to which an electronic element may be secured, (2) an upwardly extending flanged metallic frame member hermetically joined to the periphery of the base member so as to provide a shallow flat cavity, (3) at least one semiconductor element or electronic component joined to the upper surface of the base member with the terminal pins electrically connected to portions of the device, (4) a thin cover plate joined to the flanged frame member to provide a hermetic enclosure for the device, and (5) a plurality of flat surfaced electrical leads joined to the bottom surface of the base and connected electrically to the exterior ends of the terminal pins.

The insulating base member may comprise a ceramic, such as, alumina, beryllia, porcelain or a high silica glass, or it may comprise a ceramic coated metal, such as molybdenum, tungsten, a copper base alloy, nickel-cobalt-iron alloy selling under the trade name Kovar coated with alumina applied by flame spraying. It is particularly desirable that the base member have thermal expansion characteristaics closely similar to the semiconductor member that is subsequently joined thereto. A high alumina ceramic has given good results. Thin separate layers of metal are sprayed by Schoop spray or by plasma jet spray and applied over the bottom surface of the base about the lower ends of the terminal pins to facilitate subsequent joining operations of the flat electrical leads.

The flanged metallic frame member is joined to the outer periphery of the upper surface of the base member, preferably by brazing or soldering. The semiconductor element is joined by soldering or brazing or the like to the upper surface of the base member within the cavity defined by the frame member. A layer of sprayed metal or vacuum deposited metal, subsequently plated may be applied below the element to facilitate joining if the base member is comprised of a ceramic material, before joining the semiconductor element thereto. The proper components or areas of the semiconductor device are electrically connected individually to the inward ends of the terminal pins by wires, clips or the like. A plurality of flat surfaced electrical leads are joined by brazing or welding the metallized areas on the lower surface of the base member and are electrically connected individually to the exterior ends of each of the terminal pins. The relatively flat, substantially thin cover plate comprises a ceramic or preferably a metal and is joined to the flange of the frame member to provide a hermetic enclosure for the semiconductor element.

Referring to FIG. 1 there is shown a part of the semiconductor device 5 of the invention. The device 5 comprises a relatively flat base member 12 having a plurality of vertically disposed metallized terminal pins 14 passing therethrough. A semiconductor element 18 is joined by brazing to a metallized area on the upper surface of the base member 12 and its areas are electrically connected by strips 19 to the interior ends of the terminal pins 14. A plurality of flat surfaced electrical leads 20 are brazed or welded to the metallized areas on the lower surface of the base member and are electrically connected to the outer ends of each terminal pin.

Referring to FIG. 2 there is shown the complete semiconductor device 10. The device 10 comprises the base member 12 with the vertically disposed terminal pins 14 passing therethrough. A flanged frame member 16 is joined to the outer periphery of the base member 12 by means of brazing metal 17. The semiconductor member 18 is joined to the metallized area 28 on the upper surface of the base member 12 and makes electrical contact through strips 19 with the upper ends of the terminal pins 14. The electrical leads 20 are joined to metallized surface strips 21 on the lower surface of the base member and are electrically connected to the outer end of each of the terminal pins 14. A substantially thin, relatively flat cover plate 22 is welded or brazed to the flange of the frame member 16 at the peripheral lip 23 projecting downwardly from the cover plate 22 to provide a hermetic enclosure for the semiconductor element 18.

The following example is illustrative of the teachings of the invention. A device was prepared similar to that shown in FIGS. 1 and 2. The device comprised a base member (.425 x .335 inch) composed of a ceramic comprising 96% alumina. The terminal pins disposed through the base member comprised a nickel-cobalt-iron alloy selling under the tradename Kovar. A functional electronic element (.150 x .250 inch) was brazed to a metallized upper surface layer on the base member. A flanged metal frame member, for example a nickel-cobalt-iron alloy selling under the tradename Ceramiseal, was joined to the outer periphery of the base member. A plurality of electrical leads were brazed to the lower metallized surface areas of the base member and were electrically connected by brazing to the terminal pins, the electrical leads comprising flat strips of copper having a thickness of about .003 inch. A nickel cover plate having approximately the same dimensions as the base member and having the same peripheral contour as the flanged frame member, was welded to the flange of the frame member in an inert atmosphere. It was tested with good results.

While the invention has been described with reference to particular embodiments and examples, it will be understood, of course, that modifications, substitutions, and the like may be made therein without departing from its scope.

We claim as our invention:

1. A semiconductor device comprising a relatively thin, substantially flat base member of good thermal conductivity and having a plurality of vertically disposed terminal pins passing therethrough, a flanged metallic frame member disposed on and joined to the outer periphery of the upper surface of the base member, at least one semiconductor element joined to the upper surface of the base member within the frame member and having portions electrically connected to one end of the terminal pins, the thermal expansion characteristics of the base member and the semiconductor member being closely similar, a plurality of flat surfaced electrical leads joined to the lower surface of the base member and electrically connected to the other end of each of the terminal pins and a relatively flat, substantially thin cover plate joined to the flange of the frame member to provide a hermetic enclosure for the semiconductor element.

2. A semiconductor device comprising a relatively thin substantially flat, ceramic, apertured base member of good thermal conductivity having a plurality of vertically disposed terminal pins passing therethrough in the apertures, a flanged metallic frame member disposed on and joined to the outer periphery of the upper surface of the base member, at least one semiconductor element joined to the upper surface of the base member within the area delineated by the frame member and having portions electrically connected to one end of the terminal pins, the thermal expansion characteristics of the base member and the semiconductor member being closely similar, a plurality of flat surfaced electrical leads joined to the lower surface of the base member and electrically connected to the other end of the terminal pins and a relatively flat, substantially thin metallic cover plate joined to the flange of the frame member to provide a hermetic enclosure for the semiconductor element.

3. A semiconductor device comprising a relatively thin, substantially flat, apertured base member of good thermal conductivity having a plurality of vertically disposed terminal pins passing therethrough in the apertures, a metallic flanged frame member disposed on and joined to the outer periphery of the upper surface of the base member, at least one semiconductor element joined to the upper surface of the base member within the area delineated by the frame member and having portions electrically connected to one end of the terminal pins, the thermal expansion characteristics of the base member and the semiconductor member being closely similar, a plurality of flat surfaced electrical leads joined to the lower surface of the base member and electrically connected to the other end of the terminal pins and a relatively flat, substantially thin cover plate joined to the flange of the frame member to provide a hermetic enclosure for the semiconductor element.

4. A semiconductor device comprising a relatively thin, substantially flat metallic, apertured base member of good thermal conductivity having a plurality of vertically disposed terminal pins passing therethrough in the apertures, a metal flanged frame member disposed on and joined to the outer periphery of the upper surface of the base member and extending outwardly therefrom, a semiconductor element joined to the upper surface of the base member within the area delineated by the frame member and electrically connected to one end of the terminal pins, the thermal expansion characteristics of the base member and the semiconductor member being closely similar, a plurality of electrical leads joined to the lower surface of the base member and electrically connected to the other end of the terminal pins and a relatively flat, substantially thin metallic cover plate joined to the flange of the frame member to provide a hermetic enclosure for the semiconductor element.

5. A semiconductor device comprising, in a stacked arrangement, a relatively thin, substantially flat, ceramic, apertured base member comprising a high proportion of alumina and having a plurality of terminal pins disposed vertically therethrough in the apertures, a flanged metallic frame member comprising an iron-nickel-cobalt alloy disposed on and joined to the outer periphery of the upper surface of the base member and extending outwardly therefrom, a semiconductor element joined to the upper surface of the base member within the area delineated by the frame member and electrically connected to one end of the terminal pins, the thermal expansion characteristics of the base member and the semiconductor member being closely similar, a plurality of electrical leads comprising a copper base alloy joined to the lower surface of the base member and electrically connected to the other end of the terminal pins and a relatively flat, substantially thin metallic cover plate comprising an iron-nickel-cobalt alloy joined to the flange of the frame member to provide a hermetic enclosure for the semiconductor element.

References Cited by the Examiner

UNITED STATES PATENTS

| | | | |
|---|---|---|---|
| 2,101,441 | 12/37 | Marsten | 338—309 X |
| 2,144,558 | 1/39 | Bahls | 338—237 |
| 2,240,565 | 5/41 | Marsten | 338—325 X |
| 2,728,835 | 12/55 | Mueller | 338—309 X |
| 2,931,996 | 4/60 | Brandeburg | 338—237 |
| 2,990,501 | 6/61 | Cornelison et al. | 317—234 |
| 3,020,454 | 2/62 | Dixon | 317—234 |
| 3,021,461 | 2/62 | Oakes et al. | 317—235 |
| 3,061,762 | 10/62 | Schlegel | 339—17 X |

RICHARD M. WOOD, *Primary Examiner.*

ANTHONY BARTIS, *Examiner.*